(12) United States Patent
Noujeim et al.

(10) Patent No.: US 10,267,910 B2
(45) Date of Patent: Apr. 23, 2019

(54) FREQUENCY-SCALABLE IMAGING RADAR

(71) Applicant: ANRITSU COMPANY, Morgan Hill, CA (US)

(72) Inventors: Karam Noujeim, Los Altos, CA (US); Kyle Stickle, Los Gatos, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 362 days.

(21) Appl. No.: 15/294,431

(22) Filed: Oct. 14, 2016

(65) Prior Publication Data

US 2018/0217252 A1    Aug. 2, 2018

Related U.S. Application Data

(60) Provisional application No. 62/241,646, filed on Oct. 14, 2015.

(51) Int. Cl.
| | |
|---|---|
| *G01S 13/42* | (2006.01) |
| *G01S 13/88* | (2006.01) |
| *G01S 13/90* | (2006.01) |
| *H03B 19/05* | (2006.01) |

(52) U.S. Cl.
CPC ............ *G01S 13/888* (2013.01); *G01S 13/42* (2013.01); *G01S 13/90* (2013.01); *H03B 19/05* (2013.01)

(58) Field of Classification Search
CPC ...... G01S 13/88; G01S 13/885; G01S 13/887; G01S 3/888; G01S 13/90
See application file for complete search history.

(56) References Cited

U.S. PATENT DOCUMENTS

| | | | | |
|---|---|---|---|---|
| 5,361,070 A | * | 11/1994 | McEwan | A61B 5/0507 342/21 |
| 6,320,480 B1 | * | 11/2001 | Kintis | H01P 1/18 333/156 |
| 6,335,625 B1 | * | 1/2002 | Bryant | G01N 23/00 324/316 |

(Continued)

OTHER PUBLICATIONS

"Delta Doped Schottky diode nonlinear transmission lines for 480-fs, 3.5V transients", DW. van der Weide et al. Appl. Phys. Lett. 65 , 881, 1994 (Year: 1994).*

(Continued)

*Primary Examiner* — Peter M Bythrow
(74) *Attorney, Agent, or Firm* — Tucker Ellis LLP

(57) ABSTRACT

An imaging device includes an antenna configured to transmit millimeter waves, a connector adapted to connect a radio frequency (RF) signal source with the imaging device and a signal path connected between the connector and the antenna. A nonlinear transmission line (NLTL)-based frequency multiplier is arranged along the signal path to receive an RF signal from the RF signal source and increase a frequency of the RF signal to millimeter frequency to produce a millimeter wave. A NLTL-based variable delay line is arranged along the signal path between the NLTL-based frequency multiplier and the antenna. A time delay of an NLTL of the NLTL-base variable delay line is variable to steer a beam of the millimeter wave in at least one dimension as the millimeter wave is transmitted by the antenna. A receiver processes a return signal received in response to the millimeter wave.

16 Claims, 6 Drawing Sheets

(56) References Cited

U.S. PATENT DOCUMENTS

| | | | | |
|---|---|---|---|---|
| 6,396,338 B1* | 5/2002 | Huang | ............... | H03D 3/06 |
| | | | | 329/303 |
| 6,690,247 B2* | 2/2004 | Kintis | ............... | H03K 5/12 |
| | | | | 307/106 |
| 6,825,800 B1* | 11/2004 | Dudley | ............... | G01S 7/282 |
| | | | | 342/194 |
| 7,193,486 B2* | 3/2007 | Mrozek | ............... | H03B 25/00 |
| | | | | 307/106 |
| 7,449,695 B2* | 11/2008 | Zimdars | ............... | G01J 3/42 |
| | | | | 250/341.7 |
| 7,462,956 B2* | 12/2008 | Lan | ............... | H03B 25/00 |
| | | | | 307/106 |
| 7,612,629 B2* | 11/2009 | Pepper | ............... | H03B 19/05 |
| | | | | 327/106 |
| 7,733,194 B2* | 6/2010 | Lan | ............... | H04B 1/71635 |
| | | | | 307/106 |
| 7,948,428 B2* | 5/2011 | Lovberg | ............... | G01K 11/006 |
| | | | | 342/22 |
| 8,417,189 B2 | 4/2013 | Noujeim et al. | | |
| 8,878,575 B1* | 11/2014 | Blumke | ............... | H03B 19/03 |
| | | | | 327/116 |
| 8,898,605 B2* | 11/2014 | Ding | ............... | H01P 1/15 |
| | | | | 716/110 |
| 2006/0125572 A1* | 6/2006 | van der Weide | ............... | H04B 3/04 |
| | | | | 333/20 |
| 2006/0255277 A1* | 11/2006 | Cole | ............... | G01J 3/42 |
| | | | | 250/341.1 |
| 2008/0169846 A1* | 7/2008 | Lan | ............... | H03B 25/00 |
| | | | | 327/105 |
| 2016/0213303 A1* | 7/2016 | Hyde | ............... | A61B 5/1113 |

OTHER PUBLICATIONS

"Gas-absorption spectroscopy with electronic terahertz techniques", D.W. van der Weide et al. IEEE Transactions on Microwave Theory and Techniques, vol. 48, Issue 4, Apr. 2000 (Year: 2000).*

Notification of Transmittal of the International Search Report and the Written Opinion of the International Searching Authority issued for PCT/US2016/057184, dated Jun. 16, 2017, 8 pages.

Noujeim, et al. "A Compact Nonlinear-Transmission-Line-Based mm-Wave SFCW Imaging Radar", Proceedings of the 44th European Microwave Conference, Oct. 6-9, 2014; Rome, Italy; pp. 1766-1769.

* cited by examiner

Actual picture of copper tape concealed
behind 0.5-inch-thick gypsum sheet

Millimeter-wave image

FREQUENCY-SCALABLE IMAGING RADAR

CLAIM OF PRIORITY

This application claims the benefit of priority to U.S. Provisional Application titled "FREQUENCY-SCALABLE IMAGING RADAR", Application No. 62/241,646, filed Oct. 14, 2015, which application is herein incorporated by reference.

TECHNICAL FIELD

The present invention relates generally to systems and methods for detecting concealed features and objects and communicating information about the concealed features and objects.

BACKGROUND

Detecting the presence of concealed features and objects can be useful in a wide range of applications. Detection equipment is used, for example, in detecting the presence of weapons, diagnosing medical ailments and guiding surgery in patients, and identifying structural defects in buildings and infrastructure. In the case of weapon detection, detection equipment commonly includes metal detectors that generate audio cues that do not inform beyond the metallic nature of the detected object and the general location of the detected object. In high security settings such as airports, weapon detection equipment can include backscatter x-ray or millimeter wave scanners coupled to monitors for displaying images generated by the detection equipment, with the monitors often being viewed by security agents behind a desk. In the case of medical imaging, detection equipment is also commonly coupled to monitors for displaying images generated by the detection equipment, dividing the attention of a technician or a physician between the image displayed on the monitor and the patient.

Existing imagers are either ionizing (e.g. x-ray), expensive, limited in dynamic range, limited in depth information, limited in functionality, or combinations thereof. Further, there is a need to improve the amount of information communicated by detection equipment and a need to improve the way in which that information is communicated to better inform and reduce the distraction of an individual receiving the information.

SUMMARY

In accordance with an embodiment, an imaging device includes an antenna configured to transmit millimeter waves, a connector adapted to connect a radio frequency (RF) signal source with the imaging device, and a signal path connected between the connector and the antenna. A nonlinear transmission line (NLTL)-based frequency multiplier is arranged along the signal path to receive an RF signal from the RF signal source and increase a frequency of the RF signal to millimeter frequency to produce a millimeter wave. A NLTL-based variable delay line is arranged along the signal path between the NLTL-based frequency multiplier and the antenna. A time delay of an NLTL of the NLTL-base variable delay line is variable to steer a beam of the millimeter wave in at least one dimension as the millimeter wave is transmitted by the antenna. A receiver of the imaging device is adapted to process a return signal received in response to the millimeter wave.

In accordance with an embodiment, the receiver includes a directional coupler arranged to couple the millimeter wave propagating along the signal path between the NLTL-based frequency multiplier and the NLTL-based variable delay line to the receiver for use by the receiver.

In accordance with an embodiment, the NLTL-based variable delay line comprises a pair of NLTLs each including transmission lines loaded periodically with varactor diodes and the time delay of the NLTL is varied via a bias applied to the NLTL.

In accordance with an embodiment, the antenna receives the return signal and the receiver is a NLTL-based sampling directional coupler arranged to couple the return signal propagating along the signal path to the receiver for sampling by the receiver. The receiver receives a local oscillator (LO) signal from the RF signal source and downconverts sampled signals to intermediate frequency (IF) signals. A display provides an image generated by the receiver.

In accordance with another embodiment, the antenna is a first antenna, the signal path is a first signal path, the NLTL-based variable delay line is a first NLTL-based variable delay line, and the receiver is a NLTL-based sampling directional coupler and receiver. The receiver receives a local oscillator (LO) signal from the RF signal source. The image device further includes a second antenna for receiving the return signal, a second signal path connecting the second antenna with the receiver, and a second NLTL-based variable delay line arranged along the second signal path between the receiver and the second antenna. The receiver is further used to sample the return signal. The LO signal is used to downconvert signals sampled by the receiver to IF signals. A display for provides an image generated by the receiver.

In accordance with another embodiment, the antenna is a first antenna, the signal path is a first signal path, the NLTL-based variable delay line is a first NLTL-based variable delay line, and the receiver is a first receiver. The first receiver is a NLTL-based sampling directional coupler and receives a local oscillator (LO) signal from the RF signal source. The LO signal is used to downconvert signals sampled by the first receiver to IF signals. The imaging device further includes a second antenna for receiving the return signal, a second receiver, and a second signal path connecting the second antenna with the second receiver. The second receiver is a NLTL-based sampling receiver that samples the return signal. The second receiver receives the LO signal and uses it to downconvert signals sampled by the second receiver to IF signals. A second NLTL-based variable delay line is arranged along the second signal path between the second antenna and the second receiver. A display for providing an image generated by the receiver, In accordance with another embodiment, the antenna is a first antenna, the signal path is a first signal path, the NLTL-based variable delay line is a first NLTL-based variable delay line and the receiver is a first receiver and a NLTL-based sampling directional coupler. The first receiver receives a local oscillator (LO) signal from the RF signal source downconverts signals sampled by the first receiver to IF signals. The imaging device further includes a second antenna for receiving the return signal, a second receiver, a second signal path connecting the second antenna with the second receiver, and a third signal path connecting the second antenna with the second receiver. The second receiver is a NLTL-based sampling receiver that samples return signals from the second and third signal paths. The second receiver receives the LO signal and uses it to downconvert signals sampled by the second receiver to IF signals. A display provides an image generated by the receiver.

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims.

In the following description, numerous specific details are set forth to provide a thorough description of the invention. However, it will be apparent to those skilled in the art that the invention may be practiced without these specific details. In other instances, well-known features have not been described in detail so as not to obscure the invention.

Multiple different techniques can be applied to detect objects concealed by a scanned surface. For example, security at a performance venue can often employ hand-held metal detectors in the form of wands passed over a subject's outer clothing to detect metallic weapons such as guns and knives. When a metal object is detected an audio cue is given. The metal object may not be a weapon, but rather can include a belt buckle, key or wallet chain, etc. In the last decade, more sophisticated techniques have been employed for passenger and baggage screening at airports. Such techniques include backscatter x-ray scanners and passive and active millimeter wave scanners that fully scan the passenger to reveal features beneath the clothing of the passenger.

Systems and methods in accordance with embodiments can combine vector network analyzer (VNA) technology with beam steerable antennas to image, locate and monitor a variety of objects and object features, whether concealed or not. In some embodiments, millimeter wave VNA components are combined with beam steerable horn antennas to image, locate and monitor a variety of objects. Such embodiments can enable the use of an imager that is compact (relative to other imaging technologies), frequency scalable, capable of providing two dimensional (2D) images (i.e., range vs. cross-range), capable of providing three dimensional (3D) images when combined with a single linear mechanical stage or hand movement, capable of being arrayed for extended spatial coverage and speed (e.g., via multiple-input and multiple-output (MIMO)), and other such benefits.

FIGS. 1-5 illustrate circuit diagrams for a frequency-scalable, stepped-frequency continuous wave imaging radar device, in accordance with various embodiments.

Figure 1:
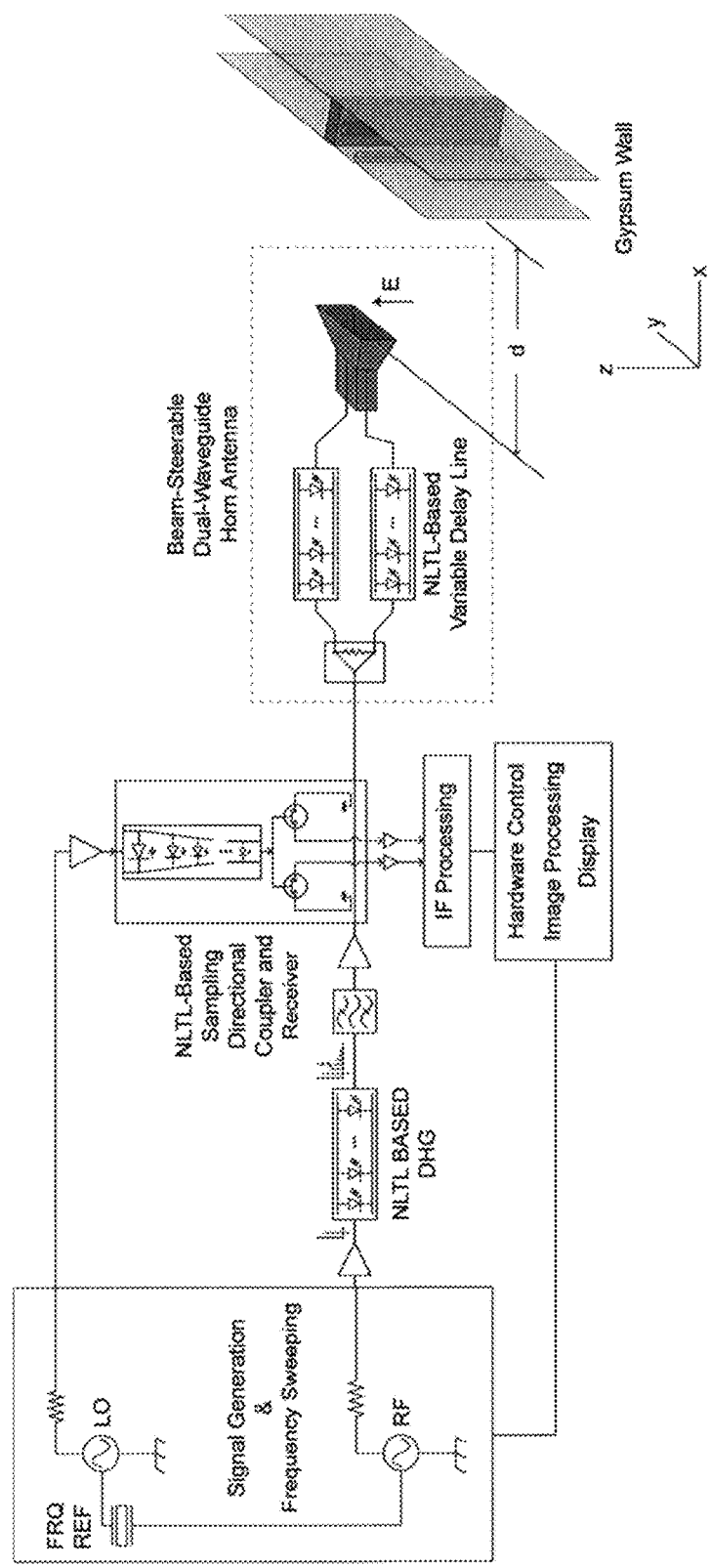
FIG. 1 is a circuit diagram of a stepped-frequency, continuous-wave monostatic imager, in accordance with an embodiment.

FIG. 1 illustrates a circuit diagram for a stepped-frequency continuous wave monostatic imager, in accordance with an embodiment. A monostatic radar includes a collocated transmitter and receiver. A VNA can be used to generate an RF signal and sweep the frequency of the RF signal. For example, the frequency of the RF signal can be swept step-wise. A beam steerable dual-waveguide horn antenna is used to transmit and receive a signal for imaging. The antenna is arranged a distance, d, from the surface through which to be imaged.

The antenna is associated with an NLTL-based variable delay line. NLTLs are distributed devices that support the propagation of nonlinear electrical waves such as shocks and solitons. In accordance with an embodiment, the NLTL-based variable delay line comprises high-impedance transmission lines loaded periodically with varactor diodes and actively or passively biased. The input frequency range of the NLTL can be designed to span gigahertz (GHz) frequencies, and is governed by the input Bragg frequency (e.g., the spacing between varactor diodes). This makes possible the use of lower harmonic numbers in samplers, with the concomitant improvement in noise figure and spurious responses.

The NLTL-based variable delay line provides a propagation medium whose phase velocity, and thus time delay is a function of the instantaneous voltage. As shown, the dual-waveguide horn antenna is steerable along the y-axis of FIG. 1 by varying the time delays in the NLTL-based variable delay line. In other embodiments, the dual-waveguide horn antenna can be made steerable along the z-axis of FIG. 1 with a third NLTL. Likewise, antennas of other embodiments described herein can be made steerable in two dimensions.

An RF signal to be transmitted is amplified and propagates to a NLTL-based distributed harmonic generator (DHG, i.e., a frequency multiplier) to produce a millimeter-wave signal which is passed through a bandpass filter, amplified and provided to the antenna. The RF signal is coupled to an NLTL-based sampling directional coupler and receiver to provide a reference for processing. The NLTL-based sampling directional coupler and receiver can receive an RF signal via the antenna by coupling the received signal to the directional coupler and downconverting the received RF signal to an intermediate frequency (IF) signal using a signal from a local oscillator (LO). The IF signal can be amplified and processed to produce an image viewable on a display.

Figure 2:
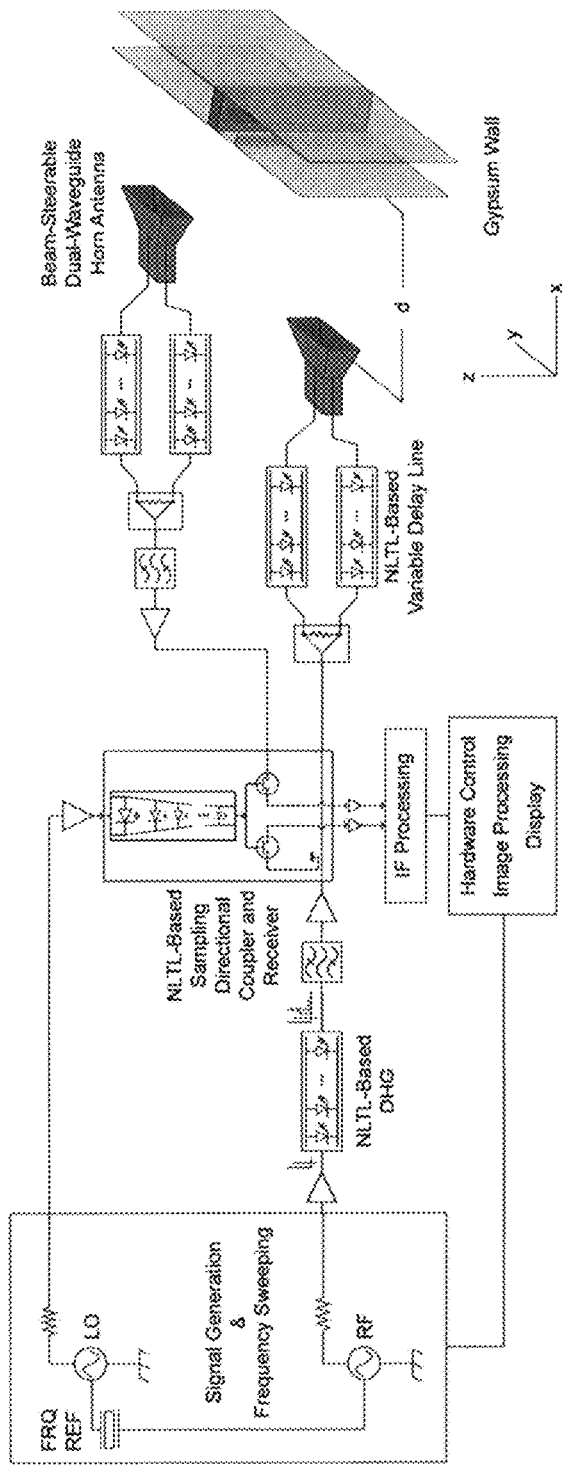
FIG. 2 is a circuit diagram of a stepped-frequency, continuous-wave bistatic imager, in accordance with an embodiment.

FIG. 2 illustrates a circuit diagram for a stepped-frequency continuous wave bistatic imager, in accordance with an embodiment. A bistatic radar includes a separate transmitter and receiver. A VNA can be used to generate an RF signal and sweep the frequency of the RF signal. For example, the frequency of the RF signal can be swept step-wise. A first beam steerable dual-waveguide horn antenna is used to transmit a signal and a second dual-waveguide horn antenna is used to receive a signal for imaging. The transmitting antenna is arranged a distance, d, from the surface through which to be imaged. The first antenna can include a NLTL-based variable delay line. An RF signal to be transmitted is amplified and propagates to a NLTL-based DHG to produce a millimeter-wave signal which is passed through a bandpass filter, amplified and provided to the first antenna. The RF signal is coupled to an NLTL-based sampling directional coupler and receiver to provide a reference for processing. The NLTL-based sampling directional coupler and receiver can receive an RF signal via the second antenna, which also includes an NLTL-based variable delay line. The received RF signal is downconverted to an IF signal using a signal from a LO. The IF signal can be amplified and processed to produce an image viewable on a display.

Figure 3:
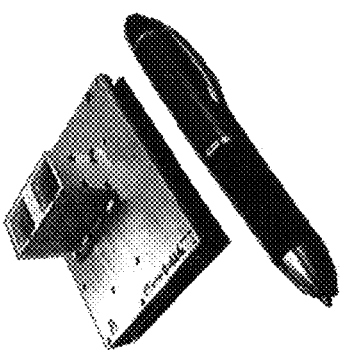
FIG. 3 is an image of a physical implementation of a stepped frequency, continuous-wave imager, in accordance with a further embodiment.

FIG. 3 illustrate a physical implementation of a bistatic waveguide, in accordance with an embodiment. As can be seen the two waveguides are arranged a fixed distance from each other integrated into a single unit. As can also be seen by the pen arranged beside the bistatic waveguide for scale, the physical implementation can be compact, thereby providing advantages in convenience and portability for imaging.

Figure 4:
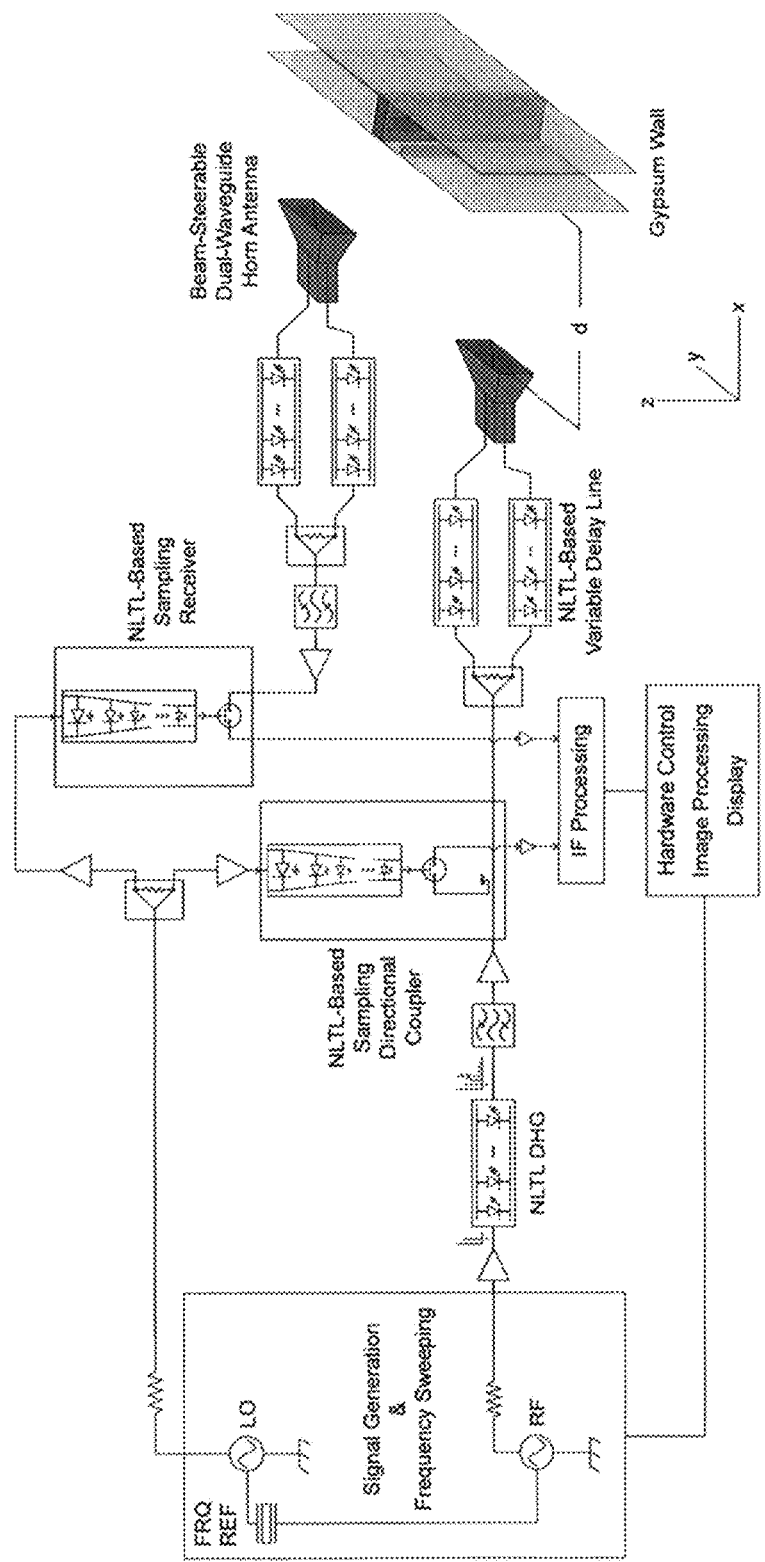
FIG. 4 is a circuit diagram of a stepped-frequency, continuous-wave bistatic imager with enhanced channel isolation, in accordance with an embodiment.

FIG. 4 illustrates a circuit diagram for a stepped-frequency continuous wave bistatic imager, in accordance with another embodiment. The imager can provide enhanced channel isolation by using separate sampling devices for the transmitted and received signals. The separately sampled transmitted and received signals are separately downconverted to IF signals, and the two IF signals are provided for processing. As above, a VNA can be used to generate an RF signal and sweep the frequency of the RF signal. For example, the frequency of the RF signal can be swept step-wise. A first beam steerable dual-waveguide horn antenna is used to transmit a signal and a second dual-waveguide horn antenna is used to receive a signal for imaging. The transmitting antenna is arranged a distance, d, from the surface through which to be imaged. The first antenna can include a NLTL-based variable delay line. An RF signal to be transmitted is amplified and propagates to a NLTL-based DHG to produce a millimeter-wave signal which is passed through a bandpass filter, amplified and provided to the first antenna. The RF signal is coupled to a NLTL-based sampling directional coupler to provide a reference IF for processing. A NLTL-based sampling receiver can receive an RF signal via the second antenna, which also includes an NLTL-based variable delay line. The received RF signal is downconverted to an IF signal using a signal from a LO. The IF signal and reference IF signal can be amplified and processed to produce an image viewable on a display.

Figure 5:
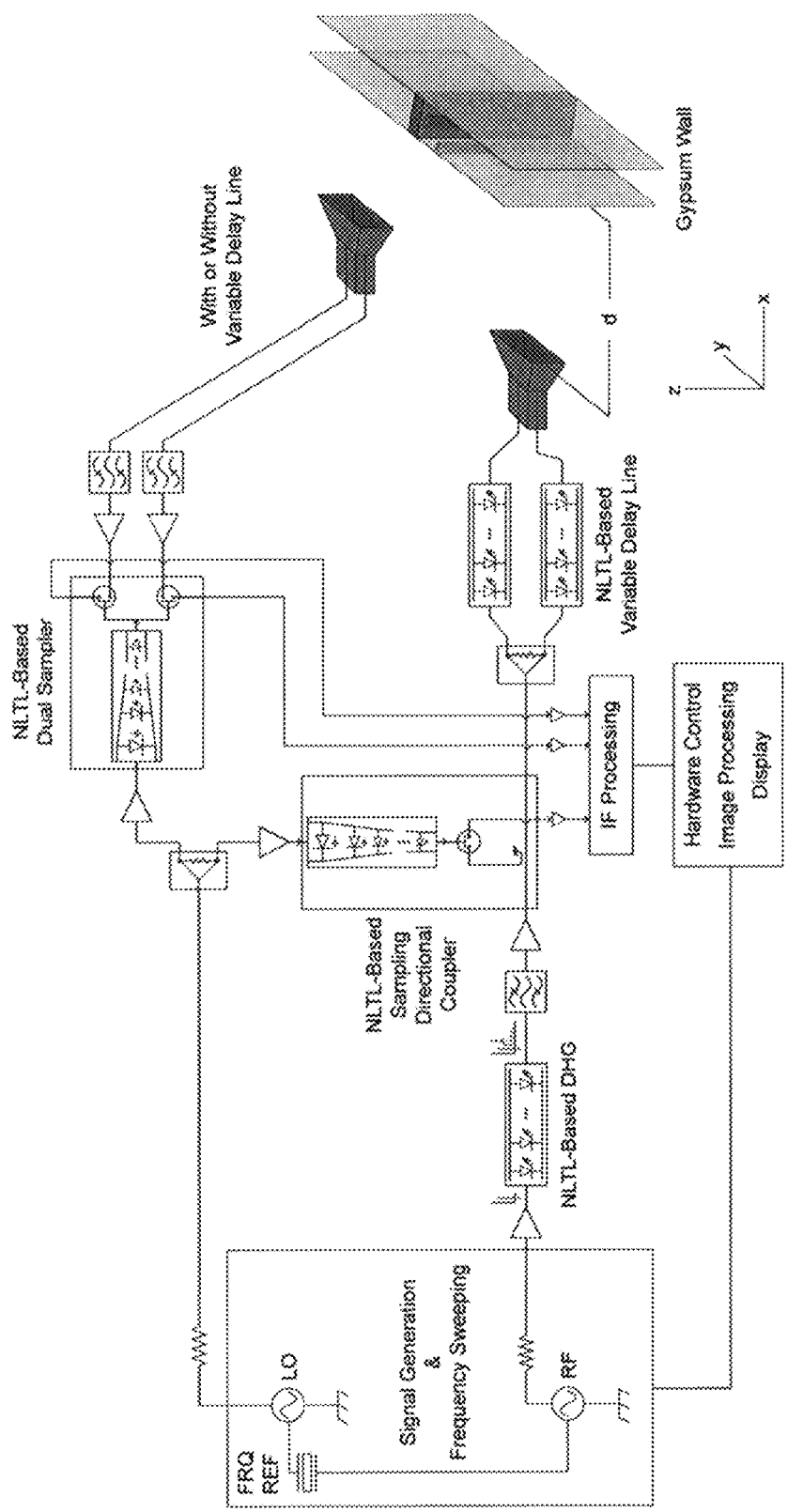
FIG. 5 is a circuit diagram of a stepped-frequency, continuous-wave bistatic imager with enhanced channel isolation and dynamic range, in accordance with an embodiment.

FIG. 5 illustrates a circuit diagram for a stepped-frequency continuous wave bistatic imager, in accordance with another embodiment. The imager can provide enhanced channel isolation by using a separate sampling devices for the transmitted and received signals, and enhanced dynamic range by receiving a signal with or without a variable delay line. The separately sampled transmitted and received signals are separately downconverted to IF signals, and the two IF signals are provided for processing. As above, a VNA can be used to generate an RF signal and sweep the frequency of the RF signal. For example, the frequency of the RF signal can be swept step-wise. A first beam steerable dual-waveguide horn antenna is used to transmit a signal and a second dual-waveguide horn antenna is used to receive a signal for imaging. The transmitting antenna is arranged a distance, d, from the surface through which to be imaged. The first antenna can include a NLTL-based variable delay line. An RF signal to be transmitted is amplified and propagates to a NLTL-based DHG to produce a millimeter-wave signal which is passed through a bandpass filter, amplified and provided to the first antenna. The RF signal is coupled to a NLTL-based sampling directional coupler to provide a reference IF for processing. A NLTL-based sampling receiver can receive an RF signal via the second antenna with or without an NLTL-based variable delay line. The received RF signals are downconverted to IF signals using a signal from a LO. The IF signals and reference IF signal can be amplified and processed to produce an image viewable on a display.

Figure 6:
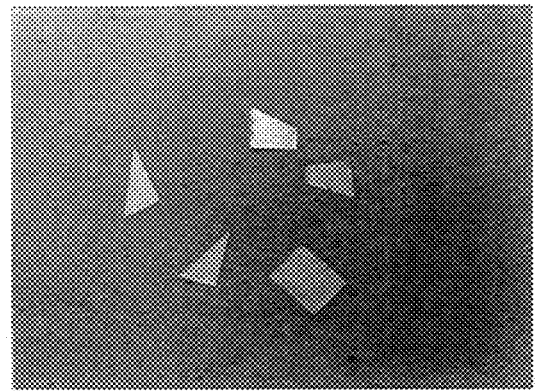
FIG. 6 illustrates an object concealed behind a gypsum wall, and an image produced by an imager in accordance with the present invention.
Figure 6:
Figure 6:
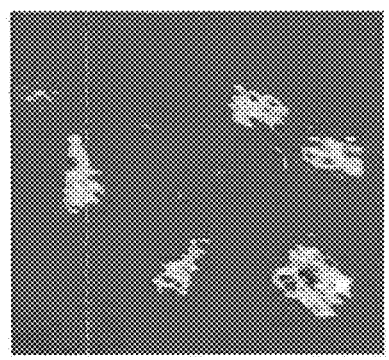

FIG. 6 shows a photographic image of objects concealed behind a gypsum wall, and an image produced by an imager in accordance with the present invention. The objects are bits of copper tape concealed behind a 0.5 inch thick gypsum sheet. Also shown in FIG. 6 is a resultant millimeter-wave image produced using a device in accordance with an embodiment of the invention.

Figure 7:
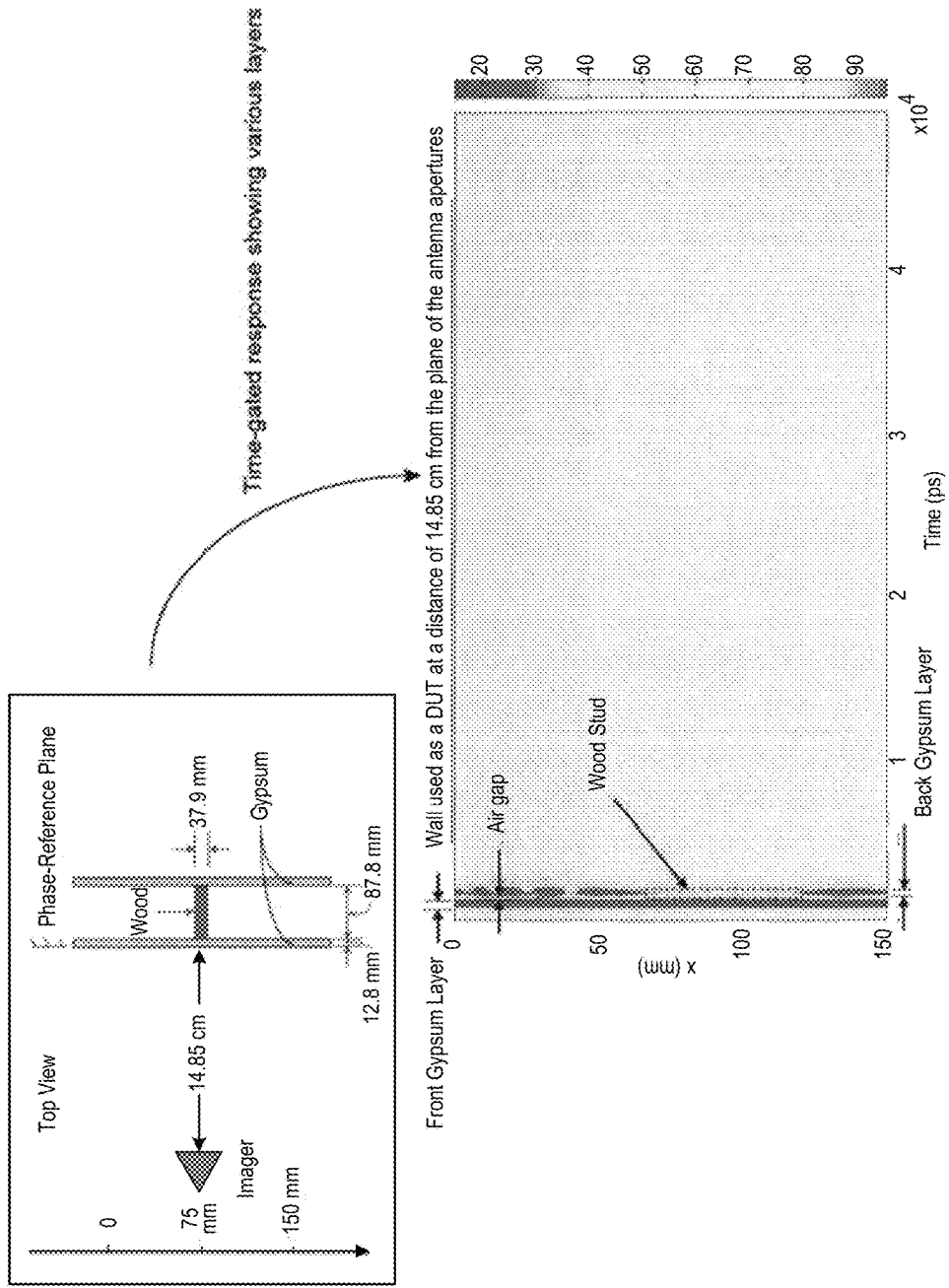
FIG. 7 illustrates a setup of a gypsum wall as a device under test (DUT) and an image of the DUT produced by an imager in accordance with the present invention.

FIG. 7 illustrates a setup of a gypsum wall as a device under test (DUT) and an image of the DUT produced by an imager in accordance with an embodiment. As can be seen, the plane of the antenna aperture is arranged approximately 6 inches away from a 0.5 inch gypsum board, which is spaced approximately 3.5 inches from another 0.5 inch gypsum board by a 2×4 wood stud. The front of the gypsum board closest to the antenna provides the reference plane. A sample image of an approximately 6 inch distance is shown revealing a gap in the imaging of the back gypsum layer, which is a result of the presence of the wood stud.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. An imaging device comprising:
    an antenna configured to transmit millimeter waves;
    a connector adapted to connect a radio frequency (RF) signal source with the imaging device;
    a signal path connected between the connector and the antenna;
    a nonlinear transmission line (NLTL)-based frequency multiplier arranged along the signal path to receive an RF signal from the RF signal source and increase a frequency of the RF signal to the extremely high frequency (EHF) band to produce a millimeter wave;
    a NLTL-based variable delay line arranged along the signal path between the NLTL-based frequency multiplier and the antenna,
    wherein a time delay of an NLTL of the NLTL-base variable delay line is variable to steer a beam of the millimeter wave in at least one dimension as the millimeter wave is transmitted by the antenna; and a receiver adapted to process a return signal received in response to the millimeter wave.

2. The imaging device of claim 1, wherein the receiver includes a directional coupler arranged to couple the millimeter wave propagating along the signal path between the NLTL-based frequency multiplier and the NLTL-based variable delay line to the receiver for use by the receiver.

3. The imaging device of claim 1, wherein
the NLTL-based variable delay line comprises a pair of NLTLs each including transmission lines loaded periodically with varactor diodes, and
the time delay of the NLTL is varied via a bias applied to the NLTL.

4. The imaging device of claim 2, wherein
the antenna receives the return signal,
the receiver is a NLTL-based sampling directional coupler arranged to couple the return signal propagating along the signal path to the receiver for sampling by the receiver,
the receiver receives a local oscillator (LO) signal from the RF signal source, and
wherein the receiver LO signal is used to downconvert sampled signals to intermediate frequency (IF) signals; and
further comprising
a display for providing an image generated by the receiver.

5. The imaging device of claim 2, wherein
the antenna is a first antenna,
the signal path is a first signal path,
the NLTL-based variable delay line is a first NLTL-based variable delay line,
the receiver is a NLTL-based sampling directional coupler and receiver, and
the receiver receives a local oscillator (LO) signal from the RF signal source, and
further comprising
a second antenna for receiving the return signal,
a second signal path connecting the second antenna with the receiver,
wherein the receiver is further used to sample the return signal,
a second NLTL-based variable delay line arranged along the second signal path between the receiver and the second antenna, and
a display for providing an image generated by the receiver,
wherein the LO signal is used to downconvert signals sampled by the receiver to intermediate frequency (IF) signals.

6. The imaging device of claim 2, wherein
the antenna is a first antenna,
the signal path is a first signal path,
the NLTL-based variable delay line is a first NLTL-based variable delay line,
the receiver is a first receiver and a NLTL-based sampling directional coupler,
the first receiver receives a local oscillator (LO) signal from the RF signal source, and
the LO signal is used to downconvert signals sampled by the first receiver to intermediate frequency (IF) signals; and
further comprising
a second antenna for receiving the return signal,
a second receiver, wherein the second receiver is a NLTL-based sampling receiver,
a second signal path connecting the second antenna with the second receiver,
wherein the second receiver samples the return signal,
a second NLTL-based variable delay line arranged along the second signal path between the second antenna and the second receiver, and
a display for providing an image generated by the receiver,
wherein the LO signal is used to downconvert signals sampled by the second receiver to IF signals.

7. The imaging device of claim 2, wherein
the antenna is a first antenna,
the signal path is a first signal path,
the NLTL-based variable delay line is a first NLTL-based variable delay line,
the receiver is a first receiver and a NLTL-based sampling directional coupler,
the first receiver receives a local oscillator (LO) signal from the RF signal source, and
the LO signal is used to downconvert signals sampled by the first receiver to intermediate frequency (IF) signals; and
further comprising
a second antenna for receiving the return signal,
a second receiver, wherein the second receiver is a NLTL-based sampling receiver,
a second signal path connecting the second antenna with the second receiver,
a third signal path connecting the second antenna with the second receiver,
wherein the second receiver samples return signals from the second and third signal paths, and
a display for providing an image generated by the receiver,
wherein the LO signal is used to downconvert signals sampled by the second receiver to IF signals.

8. A method of imaging one or both of a scanned surface and an object at least partially concealed by the scanned surface, comprising:
using an imaging device including
an antenna configured to transmit millimeter waves,
a connector adapted to connect a radio frequency (RF) signal source with the imaging device,
a signal path connected between the connector and the antenna,
a nonlinear transmission line (NLTL)-based frequency multiplier arranged along the signal path to receive an RF signal from the RF signal source and increase a frequency of the RF signal to the extremely high frequency (EHF) band to produce a millimeter wave,
a NLTL-based variable delay line arranged along the signal path between the NLTL-based frequency multiplier and the antenna,
wherein a time delay of an NLTL of the NLTL-base variable delay line is variable to steer a beam of the millimeter wave in at least one dimension as the millimeter wave is transmitted by the antenna, and
a receiver adapted to process a return signal received in response to the millimeter wave;
arranging an aperture of the antenna a predetermined distance from a surface to be scanned;
scanning the surface by transmitting a beam comprising a millimeter wave from the antenna of the imaging device to the surface;
steering the beam along the at least one dimension; and
imaging, while steering the beam, one or both of the scanned surface and an object at least partially concealed by the scanned surface based on a return signal received in response to the transmitted millimeter wave.

9. The method of claim 8, further comprising moving the aperture of the antenna relative to the surface while transmitting the beam.

10. A system for imaging one or both of a scanned surface and an object at least partially concealed by the scanned surface, comprising:
a vector network analyzer (VNA) including a radio frequency (RF) signal source;
an imaging device including
an antenna configured to transmit millimeter waves,
wherein the imaging device is adapted to receive RF signals from the RF signal source of the VNA,
a signal path connected with the antenna,
wherein the RF signals propagate along the signal path,
a nonlinear transmission line (NLTL)-based frequency multiplier arranged along the signal path to receive an RF signal from the RF signal source and increase a frequency of the RF signal to the extremely high frequency (EHF) band to produce a millimeter wave;
a NLTL-based variable delay line arranged along the signal path between the NLTL-based frequency multiplier and the antenna,
wherein a time delay of an NLTL of the NLTL-base variable delay line is variable to steer a beam of the millimeter wave in at least one dimension as the millimeter wave is transmitted by the antenna; and
a receiver adapted to process a return signal received in response to the millimeter wave.

11. The system of claim 10, wherein the receiver includes a directional coupler arranged to couple the millimeter wave propagating along the signal path between the NLTL-based frequency multiplier and the NLTL-based variable delay line to the receiver for use by the receiver.

12. The system of claim 10, wherein
the NLTL-based variable delay line comprises a pair of NLTLs each including transmission lines loaded periodically with varactor diodes, and
the time delay of the NLTL is varied via a bias applied to the NLTL.

13. The system of claim 11, wherein
the antenna receives the return signal,
the receiver is a NLTL-based sampling directional coupler arranged to couple the return signal propagating along the signal path to the receiver for sampling by the receiver,
the receiver receives a local oscillator (LO) signal from the RF signal source, and
wherein the receiver LO signal is used to downconvert sampled signals to intermediate frequency (IF) signals; and
further comprising
a display for providing an image generated by the receiver.

14. The system of claim 11, wherein
the antenna is a first antenna,
the signal path is a first signal path,
the NLTL-based variable delay line is a first NLTL-based variable delay line,
the receiver is a NLTL-based sampling directional coupler and receiver arranged to couple the return signal propagating along the signal path to the receiver for sampling by the receiver,
the receiver receives a local oscillator (LO) signal from the RF signal source, and further comprising
a second antenna for receiving the return signal,
a second signal path connecting the second antenna with the receiver,
wherein the receiver is further used to sample the return signal,
a second NLTL-based variable delay line arranged along the second signal path between the receiver and the second antenna, and
a display for providing an image generated by the receiver,
wherein the LO signal is used to downconvert signals sampled by the receiver to intermediate frequency (IF) signals.

15. The system of claim 11, wherein
the antenna is a first antenna,
the signal path is a first signal path,
the NLTL-based variable delay line is a first NLTL-based variable delay line,
the receiver is a first receiver and a NLTL-based sampling directional coupler arranged to couple the return signal propagating along the signal path to the receiver for sampling by the receiver,
the first receiver receives a local oscillator (LO) signal from the RF signal source, and
the LO signal is used to downconvert signals sampled by the first receiver to intermediate frequency (IF) signals; and
further comprising
a second antenna for receiving the return signal,
a second receiver, wherein the second receiver is a NLTL-based sampling receiver,
a second signal path connecting the second antenna with the second receiver,
wherein the second receiver samples the return signal,
a second NLTL-based variable delay line arranged along the second signal path between the second antenna and the second receiver, and
a display for providing an image generated by the receiver,
wherein the LO signal is used to downconvert signals sampled by the second receiver to IF signals.

16. The system of claim 11, wherein
the antenna is a first antenna,
the signal path is a first signal path,
the NLTL-based variable delay line is a first NLTL-based variable delay line,
the receiver is a first receiver and a NLTL-based sampling directional coupler arranged to couple the return signal propagating along the signal path to the receiver for sampling by the receiver,
the first receiver receives a local oscillator (LO) signal from the RF signal source, and
the LO signal is used to downconvert signals sampled by the first receiver to intermediate frequency (IF) signals; and
further comprising
a second antenna for receiving the return signal,
a second receiver, wherein the second receiver is a NLTL-based sampling receiver,
a second signal path connecting the second antenna with the second receiver,
a third signal path connecting the second antenna with the second receiver,
wherein the second receiver samples return signals from the second and third signal paths, a display for providing an image generated by the receiver, wherein the LO signal is used to downconvert signals sampled by the second receiver to IF signals.

* * * * *